United States Patent
Tsai (10) Patent No.: US 10,847,488 B2
(45) Date of Patent: Nov. 24, 2020

(54) SEMICONDUCTOR PACKAGE HAVING MULTI-TIER BONDING WIRES AND COMPONENTS DIRECTLY MOUNTED ON THE MULTI-TIER BONDING WIRES

(71) Applicant: MEDIATEK INC., Hsin-Chu (TW)

(72) Inventor: Shiann-Tsong Tsai, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/894,874

(22) Filed: Feb. 12, 2018

(65) Prior Publication Data

US 2018/0166414 A1    Jun. 14, 2018

Related U.S. Application Data

(63) Continuation-in-part of application No. 15/176,163, filed on Jun. 8, 2016, now Pat. No. 10,037,936.

(Continued)

(51) Int. Cl.
*H01L 23/00* (2006.01)
*H01L 23/34* (2006.01)
(Continued)

(52) U.S. Cl.
CPC .............. *H01L 24/49* (2013.01); *H01L 23/00* (2013.01); *H01L 23/3135* (2013.01);
(Continued)

(58) Field of Classification Search
CPC .................. H01L 23/3135; H01L 24/49; H01L 2224/45541
See application file for complete search history.

(56) References Cited

U.S. PATENT DOCUMENTS 6,531,760 B1   3/2003 Murakami
7,202,109 B1   4/2007 Zakharian
(Continued)

FOREIGN PATENT DOCUMENTS

CN   103250246 A   8/2013
CN   103367366 A   10/2013
(Continued)

OTHER PUBLICATIONS

Peng Su et al, An Evaluation of Effects of Molding Compound Properties on Reliability of Cu Wire Components, 2011 Electronic Components and Technology Conference, 2011, pp. 363-369, XP031996564, IEEE.

(Continued)

*Primary Examiner* — Farun Lu
(74) *Attorney, Agent, or Firm* — Wolf, Greenfield & Sacks, P.C.

(57) ABSTRACT

A semiconductor package includes a carrier substrate having a top surface, a semiconductor die mounted on the top surface, a plurality of bonding wires connecting an active surface of the semiconductor die to the top surface of the carrier substrate, an insulating material encapsulating the plurality of bonding wires, a component mounted on the insulating material, and a molding compound covering the top surface of the carrier substrate and encapsulating the semiconductor die, the plurality of bonding wires, the component and the insulating material.

19 Claims, 9 Drawing Sheets

Related U.S. Application Data (60) Provisional application No. 62/527,186, filed on Jun. 30, 2017, provisional application No. 62/251,775, filed on Nov. 6, 2015, provisional application No. 62/249,671, filed on Nov. 2, 2015.

(51) Int. Cl.
  *H01L 23/433* (2006.01)
  *H01L 23/31* (2006.01)
  *H01L 23/538* (2006.01)
  *H01L 23/495* (2006.01)
  *H01L 25/065* (2006.01)

(52) U.S. Cl.
  CPC .......... *H01L 23/34* (2013.01); *H01L 23/4334* (2013.01); *H01L 23/4952* (2013.01); *H01L 23/5386* (2013.01); *H01L 25/0657* (2013.01); *H01L 23/3128* (2013.01); *H01L 24/45* (2013.01); *H01L 2224/45139* (2013.01); *H01L 2224/45144* (2013.01); *H01L 2224/45147* (2013.01); *H01L 2224/45541* (2013.01); *H01L 2224/48091* (2013.01); *H01L 2224/4901* (2013.01); *H01L 2224/8592* (2013.01); *H01L 2924/181* (2013.01)

(56) References Cited

U.S. PATENT DOCUMENTS

| | | | |
|---|---|---|---|
| 10,037,936 B2 | 7/2018 | Tsai et al. | |
| 2003/0042615 A1 | 3/2003 | Jiang | |
| 2004/0135242 A1* | 7/2004 | Hsin | H01L 23/3128 257/686 |
| 2005/0121798 A1* | 6/2005 | Batish | H01L 24/48 257/773 |
| 2007/0090539 A1 | 4/2007 | Hosseini | |
| 2008/0124547 A1* | 5/2008 | O | H01L 24/45 428/379 |
| 2010/0164083 A1 | 7/2010 | Yim | |
| 2011/0089575 A1* | 4/2011 | Lee | H01L 23/16 257/777 |
| 2012/0068361 A1 | 3/2012 | Haba | |
| 2012/0241979 A1 | 9/2012 | Choi | |
| 2013/0137217 A1* | 5/2013 | Kindo | H01L 21/50 438/109 |
| 2013/0175709 A1 | 7/2013 | Low | |
| 2013/0256865 A1 | 10/2013 | Umeki et al. | |
| 2015/0303151 A1 | 10/2015 | Kobayashi | |
| 2017/0053893 A1 | 2/2017 | Fukue | |
| 2017/0125327 A1 | 5/2017 | Tsai et al. | |
| 2017/0194293 A1* | 7/2017 | Chang | H01L 24/96 |

FOREIGN PATENT DOCUMENTS

| | | |
|---|---|---|
| CN | 104795386 A | 7/2015 |
| DE | 10 2005 025 465 A1 | 12/2006 |
| JP | 2000-31195 A | 1/2000 |
| JP | 2006-351737 A | 12/2006 |
| JP | 2013-197531 A | 9/2013 |
| KR | 2007-0030519 A | 3/2007 |
| KR | 2014-0055448 A | 5/2014 |
| TW | 200620499 A | 6/2006 |
| TW | 200712089 | 4/2007 |
| TW | 201443975 A | 11/2014 |
| TW | 201528450 A | 7/2015 |
| WO | 2009/079122 A1 | 6/2009 |

OTHER PUBLICATIONS

Extended European Search Report dated Nov. 11, 2016 in connection with European Application No. 16177470.8.

\* cited by examiner

SEMICONDUCTOR PACKAGE HAVING MULTI-TIER BONDING WIRES AND COMPONENTS DIRECTLY MOUNTED ON THE MULTI-TIER BONDING WIRES

CROSS REFERENCE TO RELATED APPLICATION

This is a continuation-in-part of U.S. application Ser. No. 15/176,163 filed Jun. 8, 2016, which claims the priority from U.S. provisional application No. 62/249,671 filed Nov. 2, 2015 and the priority from U.S. provisional application No. 62/251,775 filed Nov. 6, 2015. This application also claims the priority from U.S. provisional application No. 62/527,186 filed Jun. 30, 2017. The above-mentioned applications are included in their entirety herein by reference.

BACKGROUND

The present disclosure relates generally to the field of semiconductor packaging. More particularly, the present disclosure relates to a semiconductor integrated circuit (IC) package with multi-tier bonding wires and component(s) stacked directly on the multi-tier bonding wires.

In the integrated circuit (IC) packaging industry, there is a continuous desire to provide higher and higher density IC packages for semiconductor die having increasing numbers of input/output (I/O) terminal pads. When using a conventional wire bonding packaging technique, the pitch, or spacing between adjacent bonding wires becomes finer and finer as the number of I/O terminal pads increases for a given size die.

During the molding or encapsulation of a plastic IC package, the flow of a plastic molding compound melt into a mold cavity exerts forces sufficiently high as to displace or deform the bonding wires, hence resulting in bonding wire sweep or mold wire sweep. The wire deformation causes adjacent bond wires to come into contact with each other, which results in shorting between adjacent wires.

Although a variety of approaches have been suggested for reducing the bonding wire sweep during the encapsulating process of an IC package, many of these approaches require additional process steps or require specialized equipment. These requirements for additional process steps or specialized equipment add to the costs of producing the package and are therefore undesirable.

SUMMARY

It is an object of the invention to provide an improved semiconductor device and package having stabilized, insulator-coated bonding wires in order to solve the above-mentioned prior art problems and shortcomings.

According to one aspect of the invention, a semiconductor package includes a carrier substrate having a top surface, a semiconductor die mounted on the top surface, a plurality of bonding wires connecting an active surface of the semiconductor die to the top surface of the carrier substrate, an insulating material encapsulating the plurality of bonding wires, a component mounted on the insulating material, and a molding compound covering the top surface of the carrier substrate and encapsulating the semiconductor die, the plurality of bonding wires, the component and the insulating material. The component may comprise a dummy silicon die, a piece of metal, or a heat sink.

According to one embodiment, a semiconductor package includes a carrier substrate having a top surface, a semiconductor die mounted on the top surface, a plurality of first bonding wires connecting the semiconductor die to the carrier substrate, an insulating material encapsulating the plurality of first bonding wires, a component mounted on the insulating material, a plurality of second bonding wires connecting the component to the carrier substrate, and a molding compound covering the top surface of the carrier substrate and encapsulating the semiconductor die, the component, the plurality of first bonding wires, the plurality of second bonding wires, and the insulating material. The component may comprise a semiconductor die or a passive device.

According to another embodiment, a semiconductor package includes a carrier substrate having a top surface, a first semiconductor die mounted on the top surface, a plurality of first bonding wires connecting the first semiconductor die to the carrier substrate, a first insulating material encapsulating the plurality of first bonding wires, a second semiconductor die mounted on the first insulating material, a plurality of second bonding wires connecting the second semiconductor die to the carrier substrate, a second insulating material encapsulating the plurality of second bonding wires, a component mounted on the second insulating material, and a molding compound covering the top surface of the carrier substrate and encapsulating the component, the first semiconductor die, the second semiconductor die, the plurality of first bonding wires, the plurality of second bonding wires, the first insulating material, and the second insulating material. The component comprises a passive device. A plurality of third bonding wires may be provided for connecting the component to the carrier substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Figure 1:
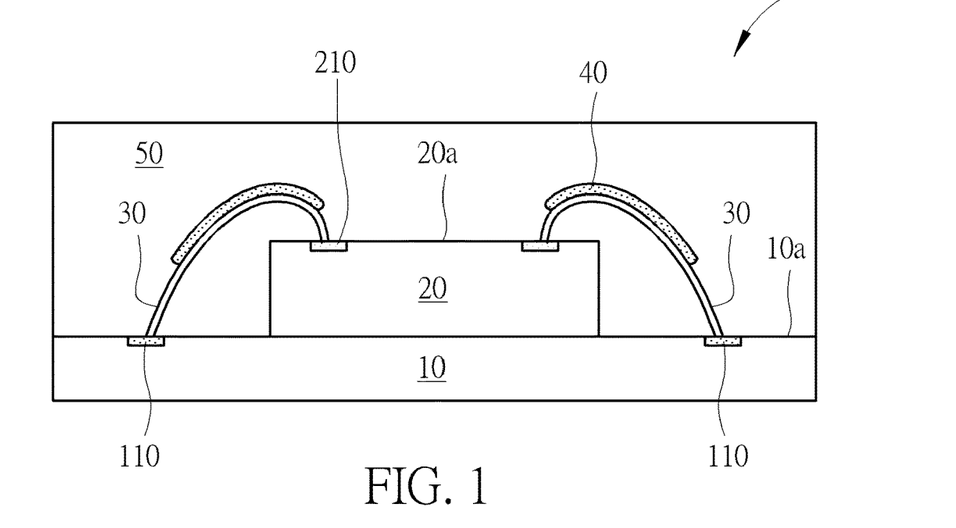
FIG. 1 is a schematic, cross-sectional diagram showing an exemplary semiconductor package with coated bonding wires according to one embodiment of the invention.
Figure 2:
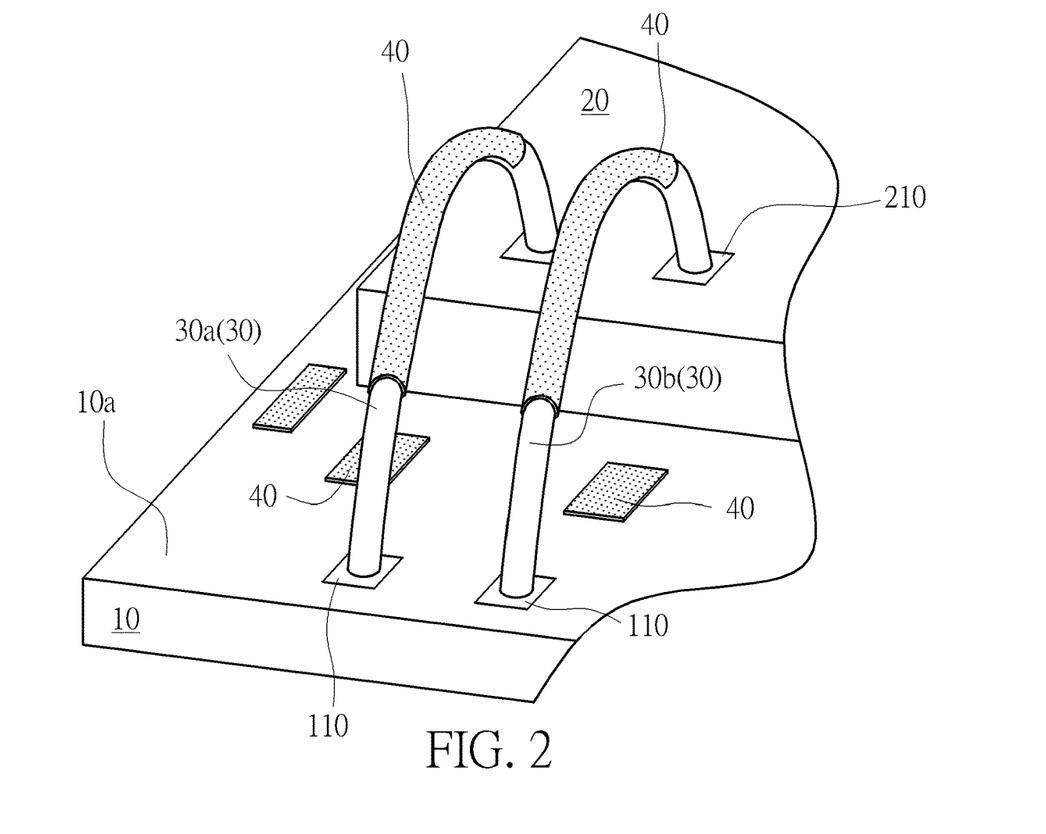
FIG. 2 is a schematic, perspective view of two adjacent bonding wires in FIG. 1 without the molding compound for clarity.

Please refer to FIG. 1 and FIG. 2. FIG. 1 is a schematic, cross-sectional diagram showing an exemplary semiconductor package with coated bonding wires according to one embodiment of the invention. FIG. 2 is a schematic, perspective view of two adjacent bonding wires in FIG. 1 without the molding compound for clarity.

As shown in FIG. 1 and FIG. 2, the semiconductor package 1 comprises a carrier substrate 10 having a top surface 10a. A semiconductor die 20 is mounted on the top surface 10a. The semiconductor die 20 has an active surface 20a, on which a plurality of input/output (I/O) pads 210 is distributed. According to the illustrative embodiment, the semiconductor die 20 is electrically connected to the bond fingers 110 on the top surface 10a of the carrier substrate 10 through a plurality of bonding wires 30. According to the illustrative embodiment, the bonding wires 30 may comprise copper, gold, silver, or any suitable conductive materials. According to the illustrative embodiment, the carrier substrate 10 may comprise a packaging substrate, an interposer substrate, or a leadframe substrate, but is not limited thereto.

According to the illustrative embodiment, the bonding wires 30 are partially coated with an insulating material 40. According to the illustrative embodiment, the insulating material 40 may comprise polymers, epoxy, or resins, but is not limited thereto. The insulating material 40 coated on the bonding wires 30 may be cured to provide the bonding wires 30 with extra mechanical support. The insulating material 40 secures the bonding wires 30 and is able to resist the mold wire sweep during the encapsulation process of the semiconductor package 1. According to the illustrative embodiment, the insulating material 40 has low permittivity or low dielectric constant (low-k) that can prevent shorting and alleviate crosstalk between adjacent wires. In other embodiments, the bonding wires 30 may be fully coated with the insulating material 40 to provide a more desirable isolation effect.

According to the illustrative embodiment, the semiconductor package 1 further comprises a molding compound 50 on the top surface 10a of the carrier substrate 10. The molding compound 50 encapsulates the bonding wires 30, the insulating material 40, and the semiconductor die 20. According to the illustrative embodiment, the molding compound 50 may comprise an epoxy resin and a filler material, but is not limited thereto. According to the illustrative embodiment, the insulating material 40 may have the same epoxy composition as that of the molding compound 50, but without the filler material or with lower content of the filler material. According to the illustrative embodiment, the insulating material 40 contains less than 50 ppm halogen content in order to prevent corrosion of the bonding wires 30. According to another embodiment, the insulating material 40 may have a composition that is different from that of the molding compound 50.

As shown in FIG. 2, only two adjacent bonding wires 30a and 30b are illustrated for the sake of simplicity. The insulating material 40 is partially coated on the portions of the two adjacent bonding wires 30a and 30b that are most likely to short to the adjacent wires during the wire sweep that occurs during the encapsulation process of the semiconductor package 1. According to the illustrative embodiment, the insulating material 40 may be also formed on the top surface 10a of the carrier substrate 10 or elsewhere in the semiconductor package 1. The insulating material 40 formed on the top surface 10a of the carrier substrate 10 may enhance the interface adhesive strength between the molding compound 50 and the carrier substrate 10.

The two adjacent bonding wires 30a and 30b may have different loop heights. It is advantageous to use the present invention because the insulating material 40 coated on the bonding wires 30a and 30b can avoid abnormal wire sweep during encapsulation process and provide significant isolation effect. Furthermore, the loop heights of the two adjacent bonding wires 30a and 30b may be reduced such that more wires can be arranged in the same space.

Figure 3:
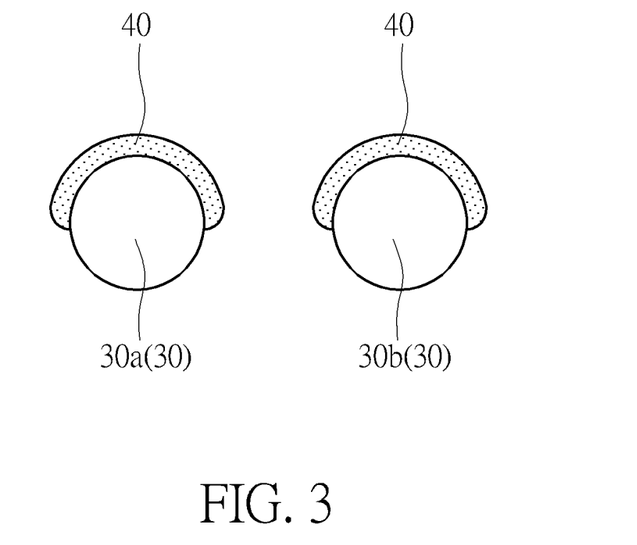
FIG. 3 is a schematic, cross-sectional diagram showing the two adjacent bonding wires and the coated insulating material.

FIG. 3 is a schematic, cross-sectional diagram showing the two adjacent bonding wires and the coated insulating material. As shown in FIG. 3, according to the illustrative embodiment, the insulating material 40 may only cover at least a partial portion, for example upper half portion, of each of the bonding wires 30 when viewed in cross-sections of the bonding wires 30. According to the illustrative embodiment, the lower half portion of each of the bonding wires 30 is not covered by the insulating material 40. However, it is understood that, in some embodiments, each of the bonding wires 30 may be wrapped around by the insulating material 40.

Figure 4:
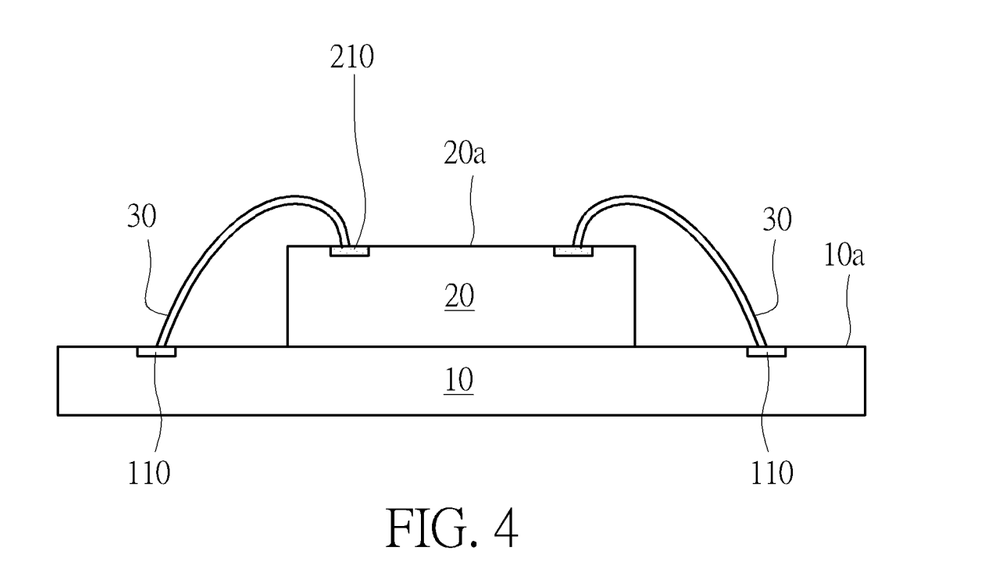
FIG. 4 to FIG. 7 are schematic, cross-sectional diagrams showing an exemplary method for forming the semiconductor package with coated bonding wires according to one embodiment of the invention.

FIG. 4 to FIG. 7 are schematic, cross-sectional diagrams showing an exemplary method for forming the semiconductor package with coated bonding wires according to one embodiment of the invention, wherein like numeral numbers designate like layers, regions, or elements. As shown in FIG. 4, a semiconductor die 20 is mounted on a top surface 10a of a carrier substrate 10. According to the illustrative embodiment, the carrier substrate 10 may comprise a packaging substrate, an interposer substrate, or a leadframe substrate, but is not limited thereto. The semiconductor die 20 may be adhered to the top surface 10a by using an adhesive (not explicitly shown), but is not limited thereto. According to the illustrative embodiment, the semiconductor die 20 is electrically connected to the bond fingers 110 on the top surface 10*a* of the carrier substrate 10 through a plurality of bonding wires 30.

Figure 5:
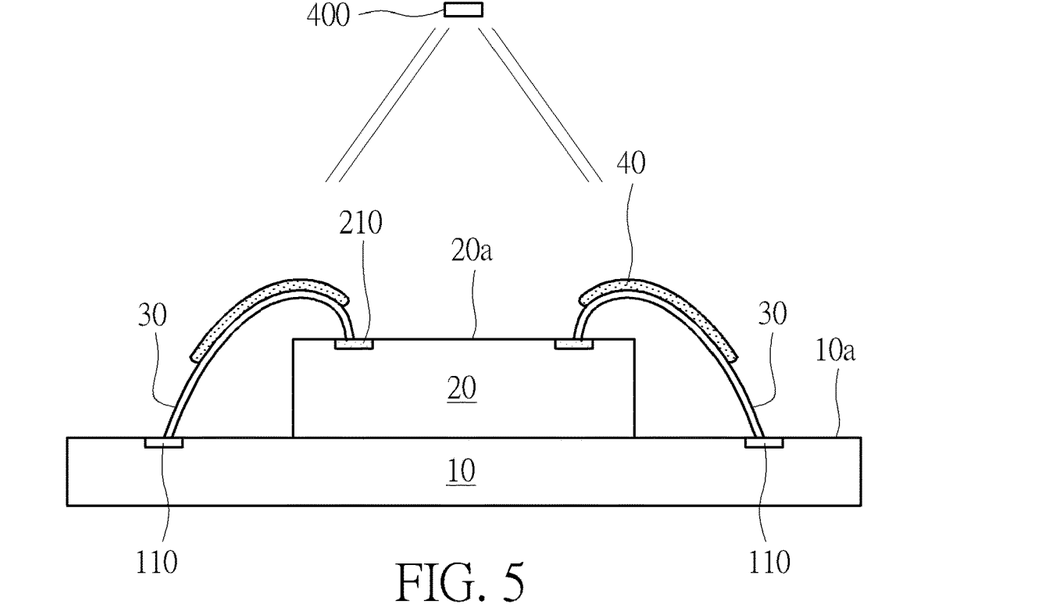
Figure 8:
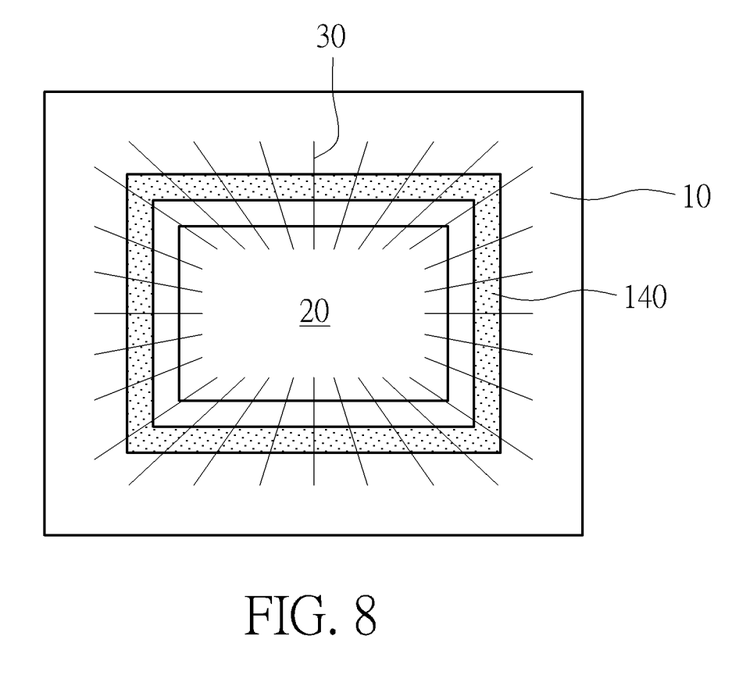
FIG. 8 is a schematic top view of the semiconductor package showing an exemplary region around the semiconductor die, in which the insulating material is sprayed.

After the wire-bonding process, an insulating material 40 is sprayed onto the bonding wires 30 within predetermined regions. For example, referring to FIG. 8, a region 140 is demonstrated around the semiconductor die 20. The insulating material 40 may be sprayed onto the bonding wires 30 within the region 140 that would be most likely to short to the adjacent wires during the encapsulation process. According to the illustrative embodiment, the insulating material 40 may be sprayed onto the top surface 10*a* of the carrier substrate 10 or onto the active surface 20*a* of the semiconductor die 20, which may enhance the interface adhesive strength between the molding compound and the substrate surface/die surface. It is understood the region 140 shown in FIG. 8 is for illustration purposes only.

Figure 9:
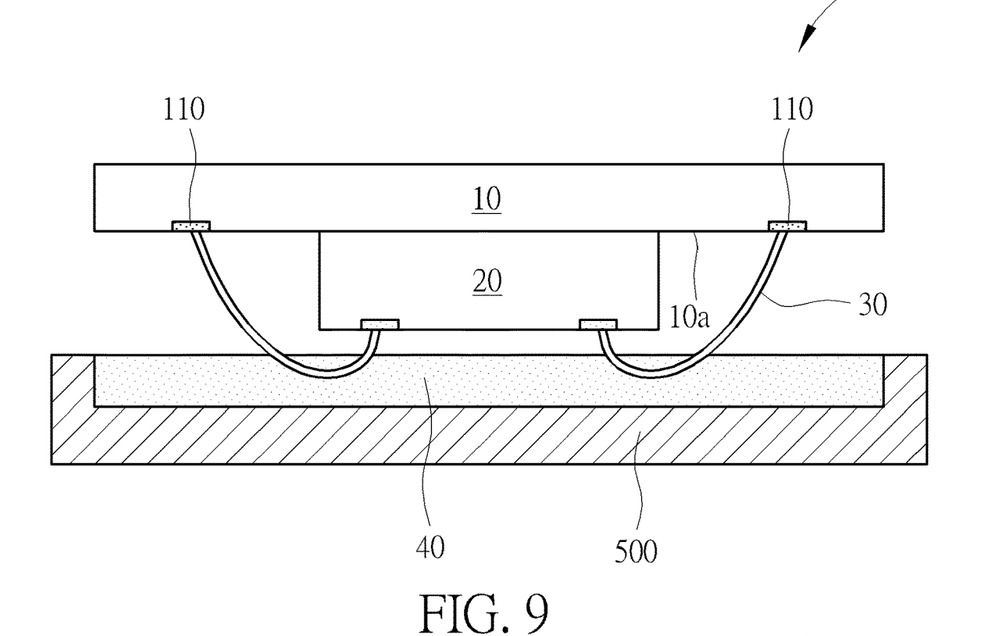
FIG. 9 is a schematic, cross-sectional diagram showing a dipping process for coating an insulating material onto the bonding wires according to another embodiment of the invention.

According to the illustrative embodiment, the insulating material 40 may be sprayed onto the bonding wires 30 by using a jet sprayer 400 or the like. However, in some embodiments, the insulating material 40 may be coated onto the bonding wires 30 by using a dipping process. For example, referring to FIG. 9, a container 500 contains the insulating material 40 in liquid phase. The package 1 is flipped and the bonding wires 30 may be partially dipped into the insulating material 40 to coat the bonding wires 30. Subsequently, a drying process or baking process may be performed to remove the solvent.

Figure 6:
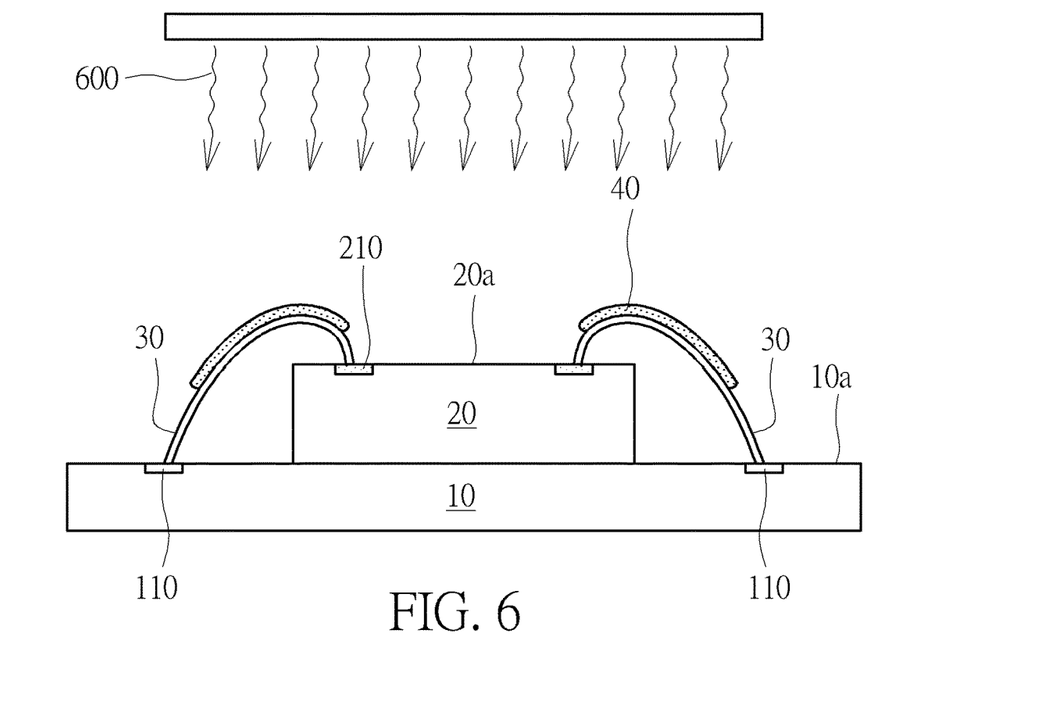

As shown in FIG. 6, after spraying the insulating material 40, an optional curing process 600 may be carried out to cure the insulating material 40. According to the illustrative embodiment, the curing process 600 may be carried out in an oven or under actinic radiation conditions, but is not limited thereto. For example, the curing process 600 may be a fast curing process under ultraviolet (UV) or infrared (IR) irradiation. It is understood that the curing process 600 may be skipped in some embodiments, and the insulating material 40 may be cured at a later stage, together with the molding compound.

Figure 7:
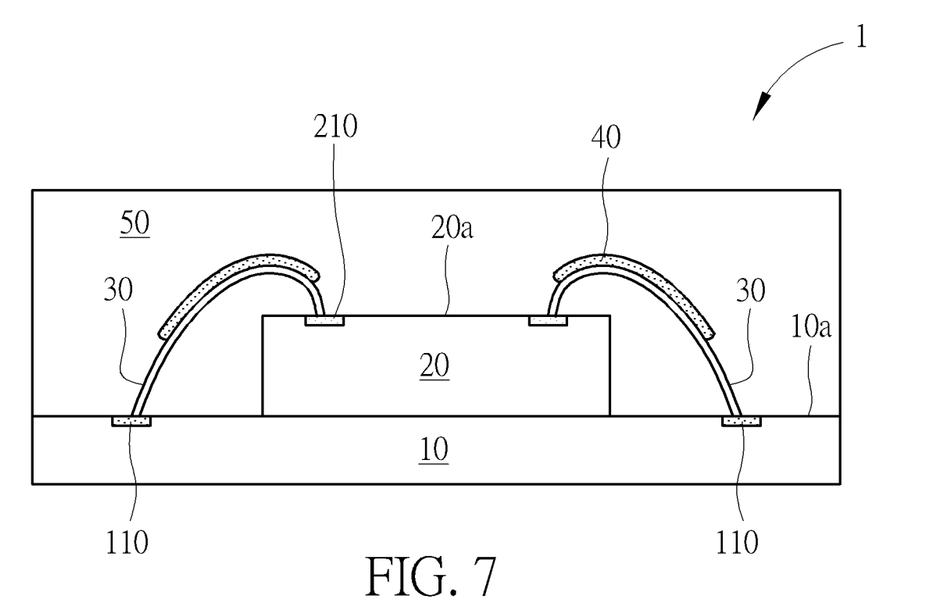

As shown in FIG. 7, a molding compound 50 is formed on the top surface 10*a* of the carrier substrate 10 to encapsulate the bonding wires 30, the insulating material 40, and the semiconductor die 20. According to the illustrative embodiment, the molding compound 50 may comprise an epoxy resin and a filler material, but is not limited thereto. According to the illustrative embodiment, the insulating material 40 may have the same epoxy composition as that of the molding compound 50, but without the filler material or with lower content of the filler material. According to the illustrative embodiment, the insulating material 40 contains less than 50 ppm halogen content in order to prevent corrosion of the bonding wires 30.

Figure 10:
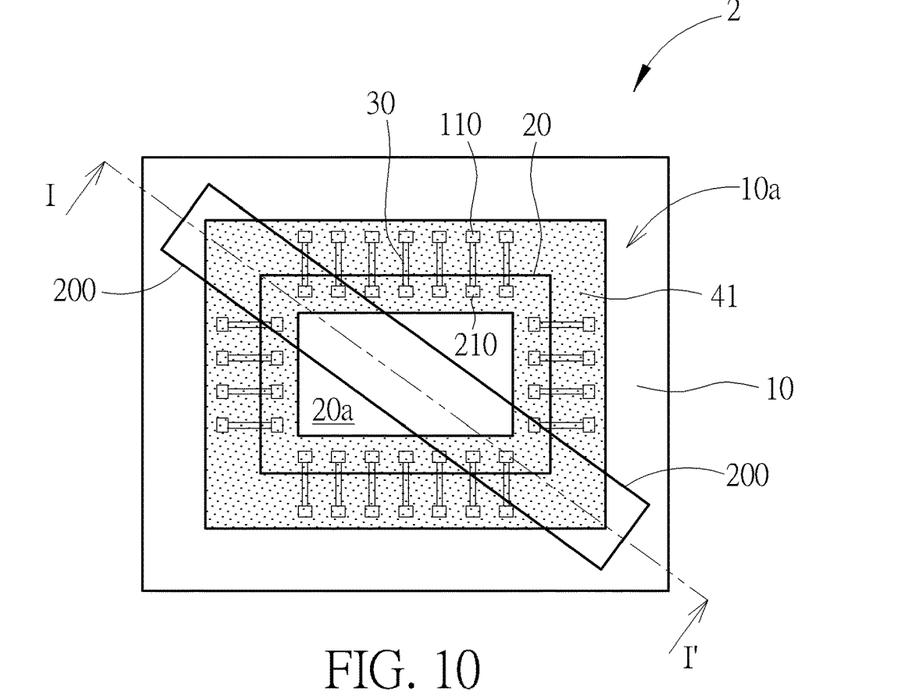
FIG. 10 is a schematic top view of a semiconductor IC package according to another embodiment of the invention.
Figure 11:
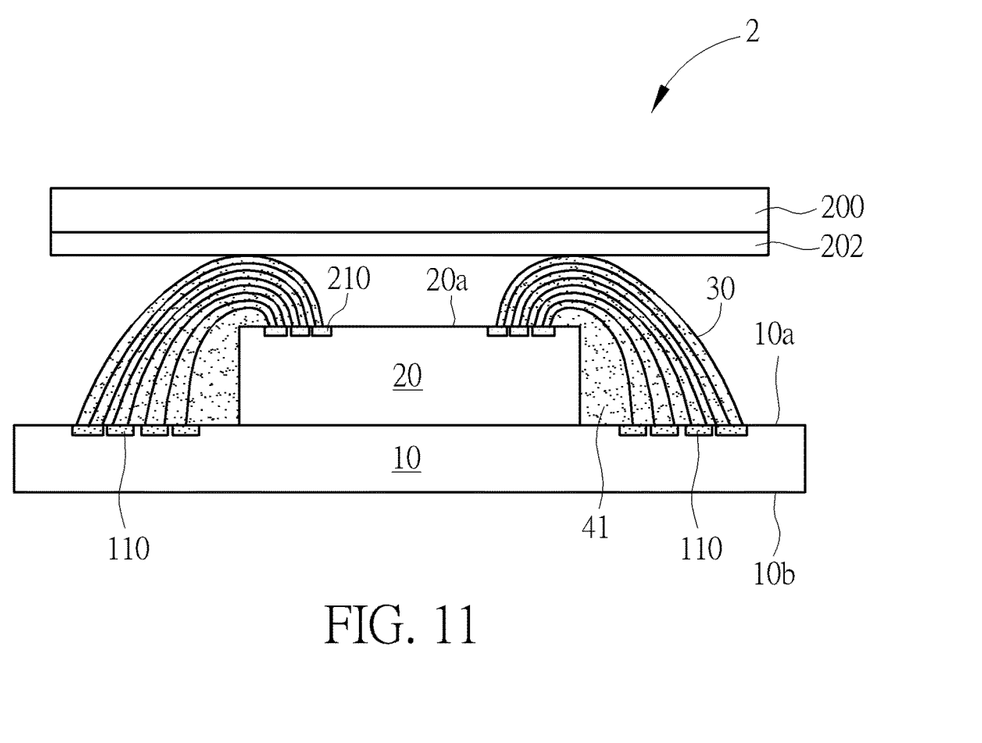
FIG. 11 is a schematic, cross-sectional view taken along line I-I' in FIG. 10.
Figure 12:
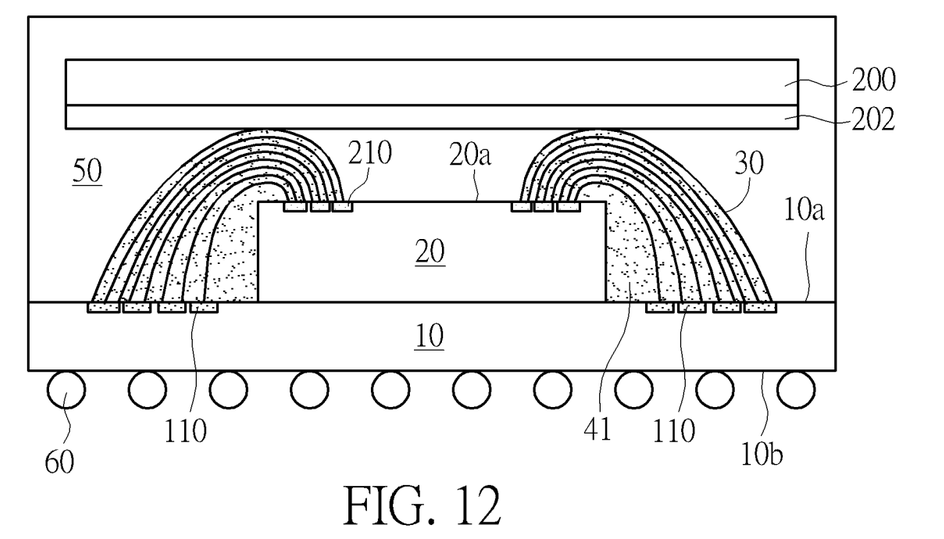
FIG. 12 shows the semiconductor IC package after molding.

Please refer to FIG. 10 to FIG. 12. FIG. 10 is a schematic top view of a semiconductor package according to another embodiment of the invention. FIG. 11 is a schematic, cross-sectional view taken along line I-I' in FIG. 10. FIG. 12 shows the semiconductor package after molding. Like layers, regions or elements are designated by like numeral numbers.

As shown in FIG. 10 and FIG. 11, the semiconductor package 2 comprises a carrier substrate 10 having a top surface 10*a* and a bottom surface 10*b*. A semiconductor die 20 is mounted on the top surface 10*a*. The semiconductor die 20 has an active surface 20*a*, on which a plurality of input/output (I/O) pads 210 is distributed. According to the illustrative embodiment, the semiconductor die 20 is electrically connected to the bond fingers 110 on the top surface 10*a* of the carrier substrate 10 through multi-tier bonding wires 30. According to the illustrative embodiment, the bonding wires 30 may comprise copper, gold, silver, or any suitable conductive materials. According to the illustrative embodiment, the carrier substrate 10 may comprise a packaging substrate or an interposer substrate, but is not limited thereto.

According to the illustrative embodiment, an insulating material 41 is applied to the bonding wires 30. For example, the insulating material 41 may be applied in a rectangular, ring shape around or about the semiconductor die 20, but is not limited thereto. The insulating material 41 may completely cover the multi-tier bonding wires 30 and is in direct contact with only a peripheral region of the active surface 20*a*. However, it is understood that the insulating material 41 may covers only a portion of the bonding wires 30. The ring-shaped insulating material 41 may be continuous or may be discontinuous. According to the illustrative embodiment, the insulating material 41 may be in direct contact with the sidewalls of the semiconductor die 20.

According to the illustrative embodiment, the insulating material 41 may comprise polymers, epoxy, fillers, or resins, but is not limited thereto. The insulating material 41 coated on the bonding wires 30 may be cured to provide the bonding wires 30 with extra mechanical support. The insulating material 41 secures the bonding wires 30 and is able to resist the mold wire sweep during the subsequent encapsulation process. According to the illustrative embodiment, the insulating material 41 has low permittivity or low dielectric constant (low-k) that can prevent shorting and alleviate crosstalk between adjacent wires.

Figure 10A:
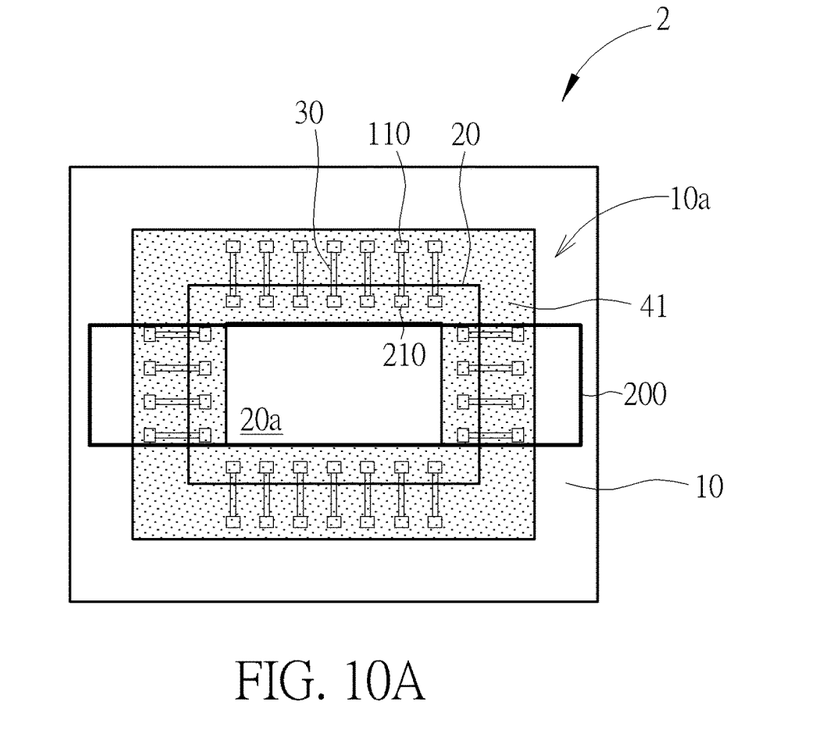
FIG. 10A is a schematic top view of a semiconductor package according to yet another embodiment of the invention.

According to the illustrative embodiment, a component 200 is mounted directly on the insulating material 41. For example, the component 200 may be a dummy silicon die, a piece of metal, or a heat sink, but is not limited thereto. The component 200 may be attached to the insulating material 41 by using an adhesive or a glue layer 202. According to the illustrative embodiment, the component 200 may have a slender shape and its longer axis may extend along the diagonal direction of the semiconductor package 2, as can be seen in FIG. 10. The mold flow direction may be orthogonal to the longer axis of the component 200. According to another embodiment, as shown in FIG. 10A, the longer side of the component 200 may be in parallel with the longer side of the semiconductor package 2.

As shown in FIG. 12, a molding compound 50 is formed on the top surface 10*a* of the carrier substrate 10 to encapsulate the bonding wires 30, the insulating material 41, the component 200, and the semiconductor die 20. According to the illustrative embodiment, the molding compound 50 may comprise an epoxy resin and a filler material, but is not limited thereto. According to the illustrative embodiment, the insulating material 41 may have the same epoxy composition as that of the molding compound 50, but without the filler material or with lower content of the filler material. According to the illustrative embodiment, the insulating material 41 and the molding compound 50 have different compositions. According to the illustrative embodiment, the insulating material 41 contains less than 50 ppm halogen content in order to prevent corrosion of the bonding wires 30. After the molding compound 50 is formed, connection elements 60 such as solder balls are formed on the bottom surface 10*b*.

Figure 13:
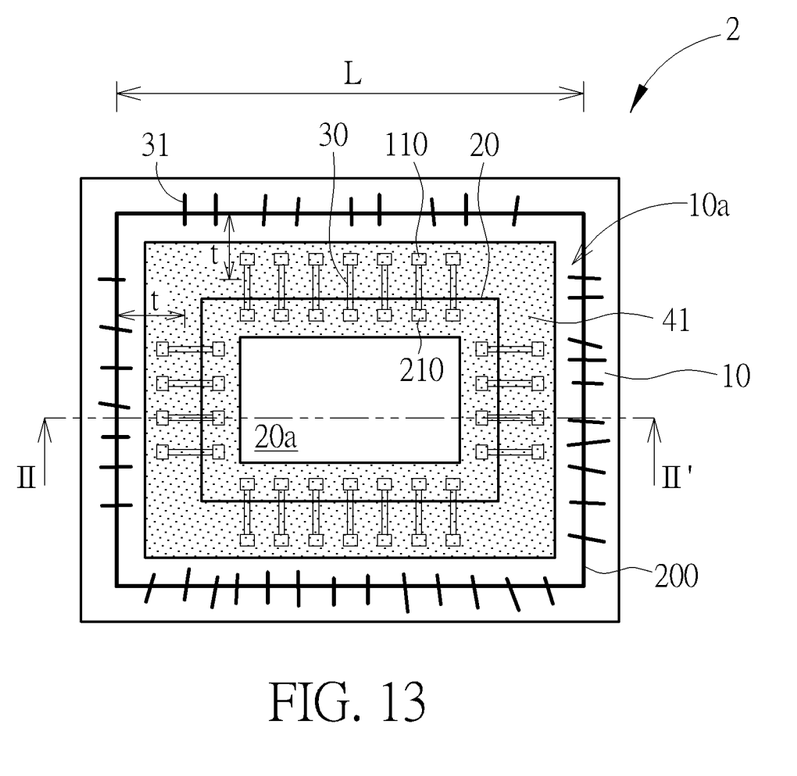
FIG. 13 is a schematic top view of a semiconductor package according to another embodiment of the invention.

FIG. 13 is a schematic top view of a semiconductor package according to another embodiment of the invention.

Figure 14:
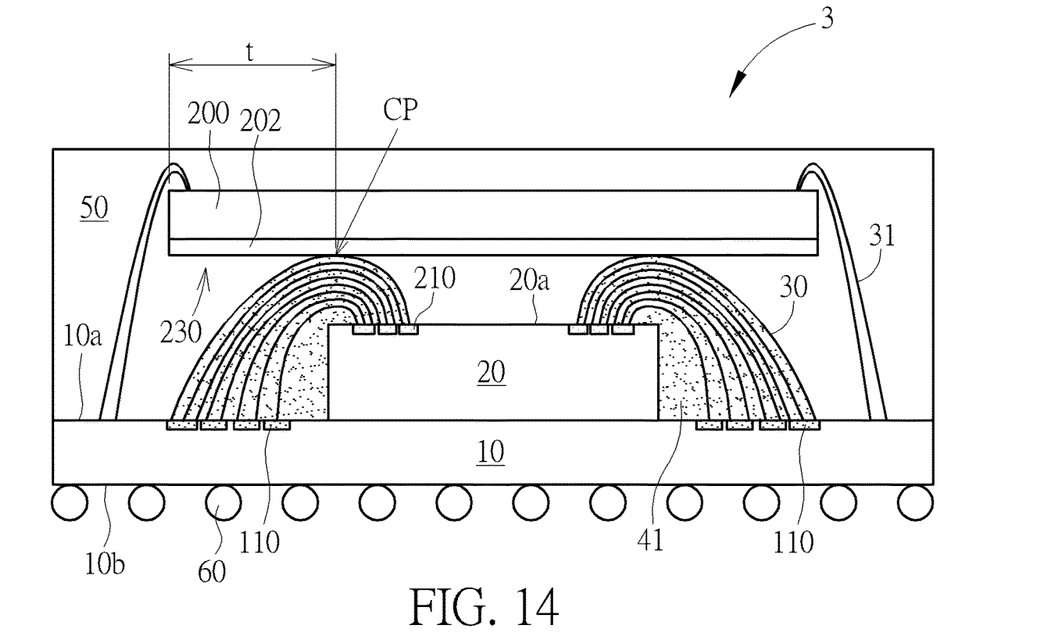
FIG. 14 is a schematic, cross-sectional view taken along line II-II' in FIG. 13.

FIG. 14 is a schematic, cross-sectional view taken along line II-II' in FIG. 13. Like layers, regions, or elements are designated by like numeral numbers. As shown in FIG. 13 and FIG. 14, likewise, the semiconductor package 3 comprises a component 200 directed mounted on the insulating material 41. According to the illustrative embodiment, the component 200 may be a semiconductor die and is wired bonded to the carrier substrate 10 through the bonding wires 31. The component 200 completely overlaps with the underlying semiconductor die 20. As cane be seen in FIG. 13, the surface area of the component 200 is greater than that of the underlying semiconductor die 20. The component 200 has a length L. The component 200 is supported by the insulating material 41 and the bonding wires 30, 31. An overhang 230 having a distance t between an edge of the component 200 and the contact point CP between the component 200 and the insulating material 41 is shown in FIG. 14. The overhang distance t may be greater than ⅓ L and may be smaller than ½ L.

The molding compound 50 is formed on the top surface 10a of the carrier substrate 10 to encapsulate the bonding wires 30, 31, the insulating material 41, the component 200, and the semiconductor die 20. The molding compound 50 may be formed by transfer mold or compression mold, but is not limited thereto.

Figure 15:
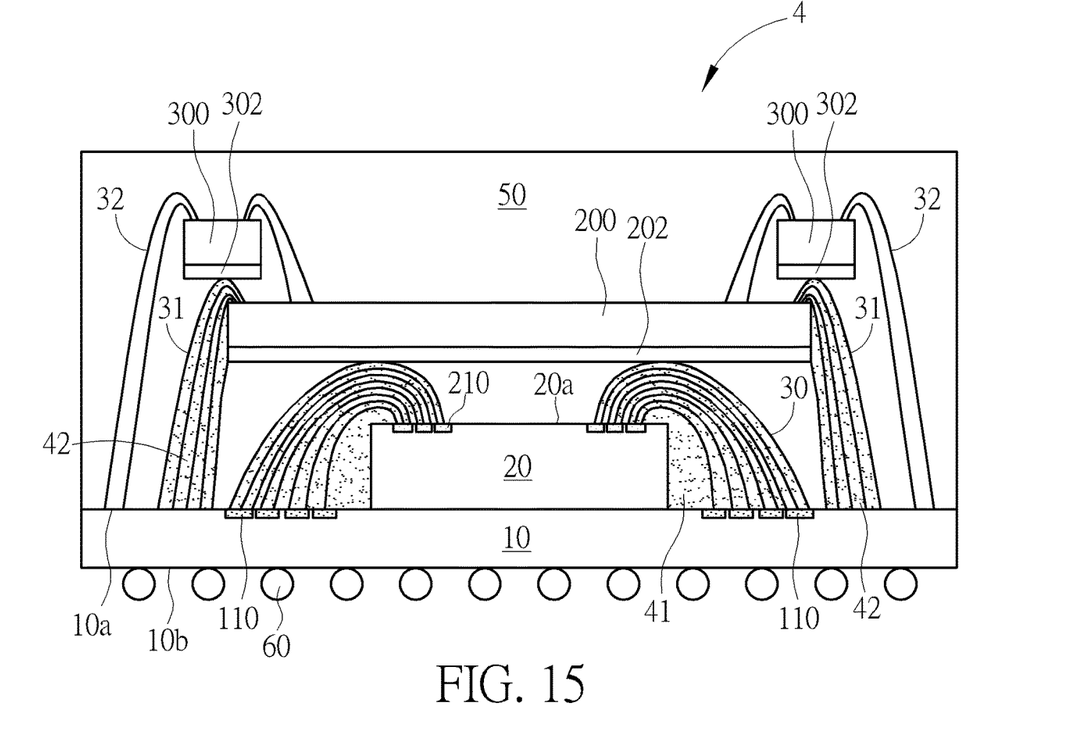
FIG. 15 is a schematic, cross-sectional view of a semiconductor package according to still another embodiment of the invention.

FIG. 15 is a schematic, cross-sectional view of a semiconductor package according to still another embodiment of the invention, wherein like layers, regions, or elements are designated by like numeral numbers. As shown in FIG. 15, likewise, the semiconductor package 4 comprises a component 200 directed mounted on the insulating material 41. According to the illustrative embodiment, the component 200 may be a semiconductor die and is wired bonded to the carrier substrate 10 through the bonding wires 31. According to the illustrative embodiment, an insulating material 42 may be applied to the bonding wires 31 so as to secure the bonding wires 31 and provide the bonding wires 31 with extra mechanical support. According to the illustrative embodiment, components 300 may be mounted directly on the insulating material 42 via adhesive layers 302. For example, the components 300 may comprise discrete passive devices including, but not limited to, capacitors, resistors or inductors. According to the illustrative embodiment, components 300 may be wire bonded to the carrier substrate 10 and/or the component 200 through the bonding wires 32. The molding compound 50 is formed on the top surface 10a of the carrier substrate 10 to encapsulate the bonding wires 30, 31, 32, the insulating material 41, 42, the component 200, the components 300, and the semiconductor die 20.

Figure 16:
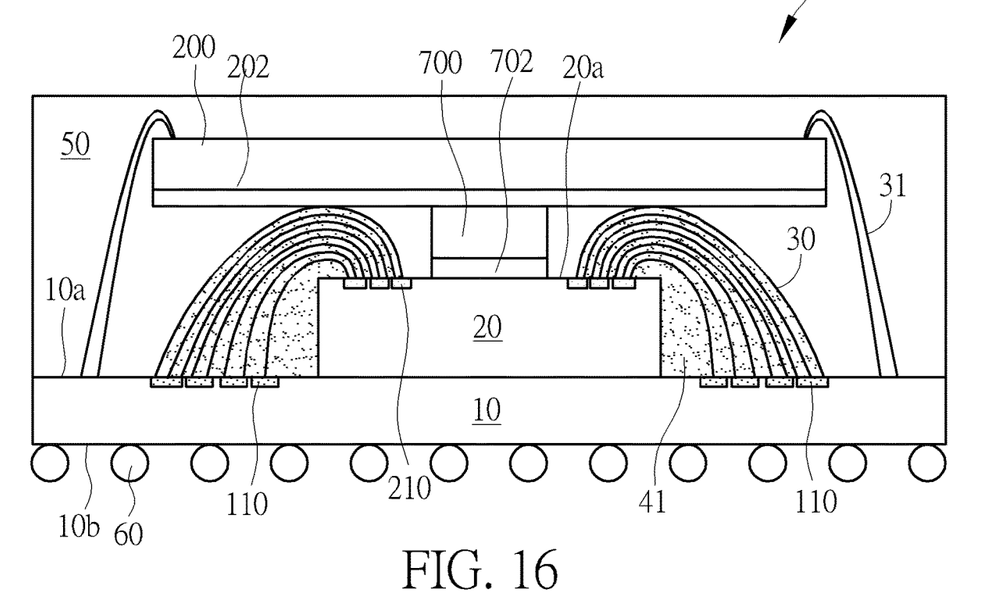
FIG. 16 is a schematic, cross-sectional view of a semiconductor package according to still another embodiment of the invention.

FIG. 16 is a schematic, cross-sectional view of a semiconductor package according to still another embodiment of the invention, wherein like layers, regions, or elements are designated by like numeral numbers. As shown in FIG. 16, the difference between the semiconductor package 5 in FIG. 16 and the semiconductor package 3 in FIG. 14 is that the semiconductor package 5 in FIG. 16 comprises a spacer 700 between the component 200 and the semiconductor die 20. The spacer 700 may be adhered to the active surface 20a of the semiconductor die 20 by using an adhesive layer 702.

Figure 17:
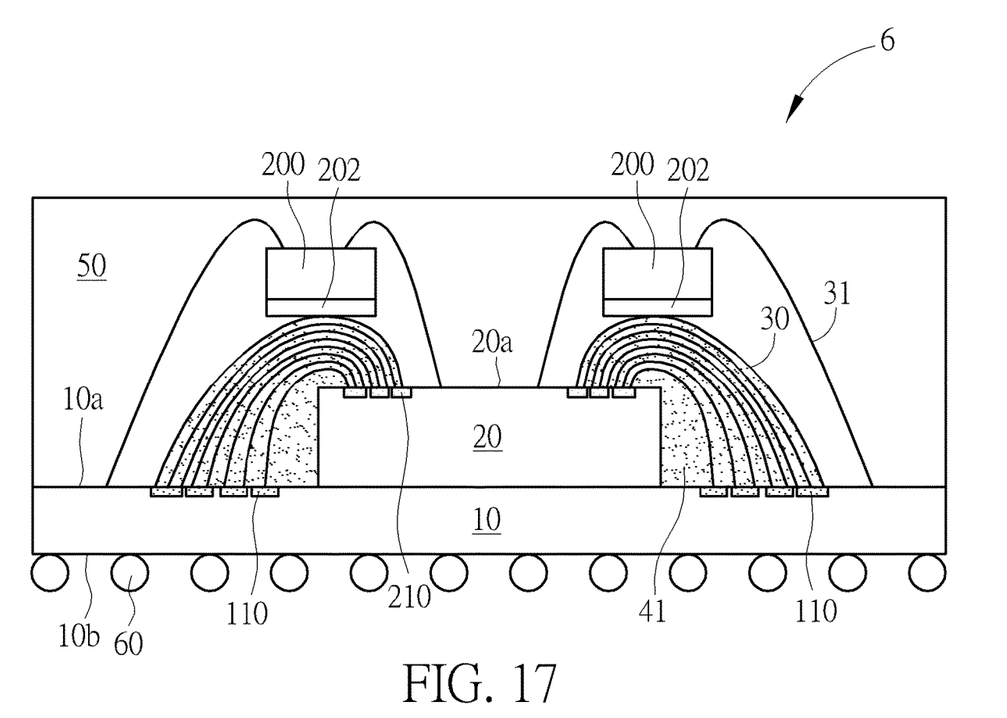
FIG. 17 is a schematic, cross-sectional view of a semiconductor package according to still another embodiment of the invention.

FIG. 17 is a schematic, cross-sectional view of a semiconductor package according to still another embodiment of the invention, wherein like layers, regions, or elements are designated by like numeral numbers. As shown in FIG. 17, the semiconductor package 6 comprises components 200 directed mounted on the insulating material 41. According to the illustrative embodiment, the components 200 may comprise a semiconductor die or a passive device such as a capacitor, a resistor or an inductor. The components 200 may be wired bonded to the carrier substrate 10 and/or the semiconductor die 20 through the bonding wires 31. The molding compound 50 is formed on the top surface 10a of the carrier substrate 10 to encapsulate the bonding wires 30, 31, the insulating material 41, the components 200, and the semiconductor die 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a carrier substrate having a top surface;
a semiconductor die mounted on the top surface;
a first plurality of bonding wires connecting an active surface of the semiconductor die to the top surface of the carrier substrate;
a second plurality of bonding wires connecting the active surface of the semiconductor die to the top surface of the carrier substrate;
a first insulating material encapsulating the first plurality of bonding wires;
a second insulating material encapsulating the second plurality of bonding wires;
a component mounted on the first insulating material and the second insulating material; and
a molding compound covering the top surface of the carrier substrate and encapsulating the semiconductor die, the first and second plurality of bonding wires, the component and the first and second insulating materials,
wherein the first plurality of bonding wires and the second plurality of bonding wires physically support the component,
wherein the first insulating material coats a top portion of individual bonding wires of the first plurality of bonding wires and is absent from a bottom portion of individual bonding wires of the first plurality of bonding wires, when viewed in cross-sections of individual bonding wires of the first plurality of bonding wires.

2. The semiconductor package according to claim 1, wherein the component comprises a dummy silicon die, a piece of metal, or a heat sink.

3. The semiconductor package according to claim 1, wherein the component is attached to the first insulating material by an adhesive layer.

4. The semiconductor package according to claim 1, wherein the component has a slender shape and its longer axis extends along a diagonal direction of the semiconductor package.

5. The semiconductor package according to claim 1, wherein a longer side of the component is in parallel with a longer side of the semiconductor package.

6. The semiconductor package according to claim 1, wherein the first and second insulating material is disposed in a rectangular, ring shape around the semiconductor die.

7. The semiconductor package according to claim 6, wherein the rectangular, ring-shaped insulating material is continuous.

8. The semiconductor package according to claim 1, wherein the first insulating material and the molding compound have different compositions.

9. The semiconductor package according to claim 1, wherein the carrier substrate comprises a packaging substrate or an interposer substrate.

10. The semiconductor package according to claim 1, further comprising:
   a third plurality of bonding wires connecting the component to the carrier substrate,
   wherein the molding compound encapsulates the third plurality of bonding wires.

11. The semiconductor package according to claim 10, wherein the component comprises a semiconductor die or a passive device.

12. The semiconductor package according to claim 10, wherein the component is attached to the first insulating material by an adhesive layer.

13. The semiconductor package according to claim 10, wherein the first and second insulating material is disposed in a rectangular, ring shape around the semiconductor die.

14. The semiconductor package according to claim 10, wherein the first insulating material and the molding compound have different compositions.

15. The semiconductor package according to claim 10, further comprising an overhang between an edge of the component and a contact point between the component and the first insulating material.

16. The semiconductor package according to claim 15, wherein the component has a length L, and the overhang has an overhang distance t between the edge of the component and the contact point, and wherein t is greater than $\frac{1}{3}L$ and smaller than $\frac{1}{2}L$.

17. The semiconductor package according to claim 10, further comprising:
   a third insulating material encapsulating the third plurality of bonding wires; and
   a second component mounted on the third insulating material; and
   wherein the molding compound encapsulates the second component and the third plurality of bonding wires.

18. The semiconductor package according to claim 17, wherein the second component comprises a passive device.

19. The semiconductor package according to claim 17 further comprising a fourth plurality of bonding wires connecting the second component to the carrier substrate.

* * * * *